(12) United States Patent
Sato et al.

(10) Patent No.: US 9,587,314 B2
(45) Date of Patent: Mar. 7, 2017

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Hitachi Kokusai Electric Inc., Tokyo (JP)

(72) Inventors: Taketoshi Sato, Toyama (JP); Hiroaki Hiramatsu, Toyama (JP); Yukitomo Hirochi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/551,900

(22) Filed: Nov. 24, 2014

(65) Prior Publication Data

US 2015/0155201 A1 Jun. 4, 2015

(30) Foreign Application Priority Data

Nov. 29, 2013 (JP) .................................. 2013-248057

(51) Int. Cl.
*H01L 21/31* (2006.01)
*C23C 16/52* (2006.01)
(Continued)

(52) U.S. Cl.
CPC .......... *C23C 16/52* (2013.01); *C23C 16/4412* (2013.01); *C23C 16/4583* (2013.01);
(Continued)

(58) Field of Classification Search
None
See application file for complete search history.

(56) References Cited

U.S. PATENT DOCUMENTS

| 5,292,554 A | 3/1994 | Sinha et al. |
| 8,382,897 B2 | 2/2013 | Sangam et al. |

(Continued)

FOREIGN PATENT DOCUMENTS

| JP | 06-120146 A | 4/1994 |
| JP | 06-295872 A | 10/1994 |

(Continued)

OTHER PUBLICATIONS

Taiwanese Notification of First Office Action, TW Application No. 10-3144463, Oct. 19, 2015, 3 pgs. (English translation provided).

(Continued)

*Primary Examiner* — Reema Patel
(74) *Attorney, Agent, or Firm* — Volpe and Koenig, P.C.

(57) ABSTRACT

Provided is a substrate processing apparatus including a substrate processing chamber configured to process a substrate; a gas supply unit configured to alternately supply a first processing gas and a second processing gas to the substrate when processing the substrate; a substrate support unit including a support mechanism configured to support a portion of a back side of the substrate and a support unit configured to support the support mechanism; a heating unit configured to heat the substrate from the back side thereof; a standby chamber configured to accommodate the substrate support unit in standby position; and a control unit configured to control at least one of the gas supply unit and a gas exhaust unit in a manner that an inner pressure of the substrate processing chamber is higher than that of the standby chamber.

12 Claims, 4 Drawing Sheets

(51) Int. Cl.
    *C23C 16/44*     (2006.01)
    *C23C 16/455*    (2006.01)
    *C23C 16/458*    (2006.01)
    *C23C 16/48*     (2006.01)

(52) U.S. Cl.
    CPC .. *C23C 16/45519* (2013.01); *C23C 16/45557* (2013.01); *C23C 16/481* (2013.01)

(56) References Cited

U.S. PATENT DOCUMENTS

| | | | |
|---|---|---|---|
| 2001/0029108 A1* | 10/2001 | Tometsuka | C23C 16/4409 438/770 |
| 2006/0154383 A1* | 7/2006 | Kannan | C23C 16/34 438/5 |
| 2006/0213439 A1* | 9/2006 | Ishizaka | C23C 16/4401 118/715 |
| 2008/0050538 A1 | 2/2008 | Hirata | |
| 2012/0285621 A1 | 11/2012 | Tan | |

FOREIGN PATENT DOCUMENTS

| | | |
|---|---|---|
| JP | 08-302473 A | 11/1996 |
| JP | 2002-151489 A | 5/2002 |
| JP | 2002-198416 A | 7/2002 |
| JP | 2004-273764 A | 9/2004 |
| JP | 2006-045640 A | 2/2006 |

OTHER PUBLICATIONS

Korean Notification of Reason of Refusal, KR Application No. 10-2014-0161472, Mar. 21, 2016, 4 pgs. (English translation provided).

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This U.S. non-provisional patent application claims priority under 35 U.S.C. §119 of Japanese Patent Application No. 2013-248057, filed on Nov. 29, 2013, in the Japanese Patent Office, the entire contents of which are hereby incorporated by reference.

BACKGROUND OF THE INVENTION

1. Field of the Invention

The present invention relates to a substrate processing apparatus, a method of manufacturing a semiconductor device and a non-transitory computer-readable recording medium.

2. Description of the Related Art

In general, a single-wafer type substrate processing apparatus used in a semiconductor device manufacturing process uses a resistance-heating heater as a wafer heating means to process a wafer (a substrate). However, when the resistance-heating heater is used, heat is transferred from, for example, an interface between the resistance-heating heater and a wafer in a reduced-pressure state, and it thus takes a considerable time until a temperature is stabilized. Thus, use of the resistance-heating heater is a main factor that lowers productivity. As a solution to this problem, it is effective to dispose a lamp on the wafer and heat the wafer using radiant heat emitted from the lamp. In this case, an entire surface of the wafer may be uniformly heated and temperature of the wafer may be quickly increased/decreased, thereby greatly decreasing a time required to heat the wafer to a substrate processing temperature, namely a preheating time.

A to-be-processed surface (surface) of or a back side of a substrate may be heated using a lamp heating method. In general, when a single-wafer type apparatus employs the lamp heating method, a gas supply mechanism is installed at a ceiling of a processing chamber opposite to a surface of a substrate so as to uniformly supply a gas. The substrate may be heated by disposing a lamp on a back side thereof due to such a mechanical restriction.

Chemical vapor deposition (CVD) or atomic layer deposition (ALD) may be used to form a thin film on a substrate. An ALD method is a method of forming a thin film by causing a source gas and a reactive gas to react with each other on a surface of a substrate. In order to prevent the source gas and the reactive gas from reacting from each other on locations other than the surface of the substrate, the ALD method preferably includes a purging process of removing a residual gas while each of gases is supplied. Since a film thickness may be controlled at an atomic level using the ALD method, the ALD method is effective to form a film in, for example, a groove having high step coverage. Thus, it is effective to perform the ALD method using a lamp in order to form a thin film in a groove having high step coverage or the like while maintaining high productivity.

SUMMARY OF THE INVENTION

When the lamp heating method is employed to form an atomic layer deposition (ALD) film, the following problems may be considered. A gas supplied to a back side of a substrate is attached to a surface of a lamp and a film is thus formed on the lamp (a window formed between a lamp accommodation chamber accommodating the lamp and a processing chamber). Thus, the heat conduction characteristics of the lamp greatly change to increase a variation in wafer temperature. In order to prevent a film from being attached to the surface of the lamp, pressure applied to a back side of a wafer may be set to be higher than pressure applied to a surface of the wafer so that a gas may not be supplied to the back side of the wafer. However, the wafer is lifted due to the difference between the pressures applied to the back side and the surface of the wafer, thereby causing misalignment of the wafer. Although pressure control may be performed such that the same pressure is applied to the surface and the back side of the wafer so as to prevent misalignment of the wafer, the pressure sharply changes when supply of a gas is switched to supply of another gas, thereby causing misalignment of the wafer. The misalignment of the wafer may cause a gas to be supplied to the back side of the wafer, thereby forming a film on a surface of the lamp.

In order to solve these problems, it is a main object of the present invention to provide a substrate processing apparatus capable of forming a thin film in a groove having high step coverage or the like while maintaining high productivity, a method of manufacturing a semiconductor device and a non-transitory computer-readable recording medium.

According to one aspect of the present invention, there is provided a substrate processing apparatus including:

a substrate processing chamber configured to process a substrate;

a gas supply unit configured to alternately supply a first processing gas and a second processing gas to the substrate when processing the substrate;

a substrate support unit including a support mechanism configured to support a portion of a back side of the substrate and a support unit configured to support the support mechanism;

a heating unit configured to heat the substrate from the back side thereof;

a standby chamber configured to accommodate the substrate support unit in standby position; and a control unit configured to control at least one of the gas supply unit and a gas exhaust unit in a manner that an inner pressure of the substrate processing chamber is higher than that of the standby chamber.

According to another aspect of the present invention, there is provided a method of manufacturing a semiconductor device, including:

(a) accommodating a substrate support unit in standby position, moving a substrate to a substrate processing position, and alternately supplying a first processing gas and a second processing gas to a surface of the substrate; and (b) alternately supplying the first processing gas and the second processing gas with an inner pressure of a substrate processing chamber being higher than that of a standby chamber while heating the substrate from a back side thereof.

DETAILED DESCRIPTION OF THE PREFERRED EMBODIMENTS

Hereinafter, an embodiment of the present invention will be described with reference to the accompanying drawings.

(1) Structure of Substrate Processing Apparatus

First, a substrate processing apparatus according to an embodiment of the present invention will be described.

A substrate processing apparatus 100 according to an embodiment of the present invention will be described below. The substrate processing apparatus 100 is an apparatus for forming a thin film on a substrate 200, and is configured as a single-wafer type substrate processing apparatus as illustrated in FIG. 1.

Figure 1:
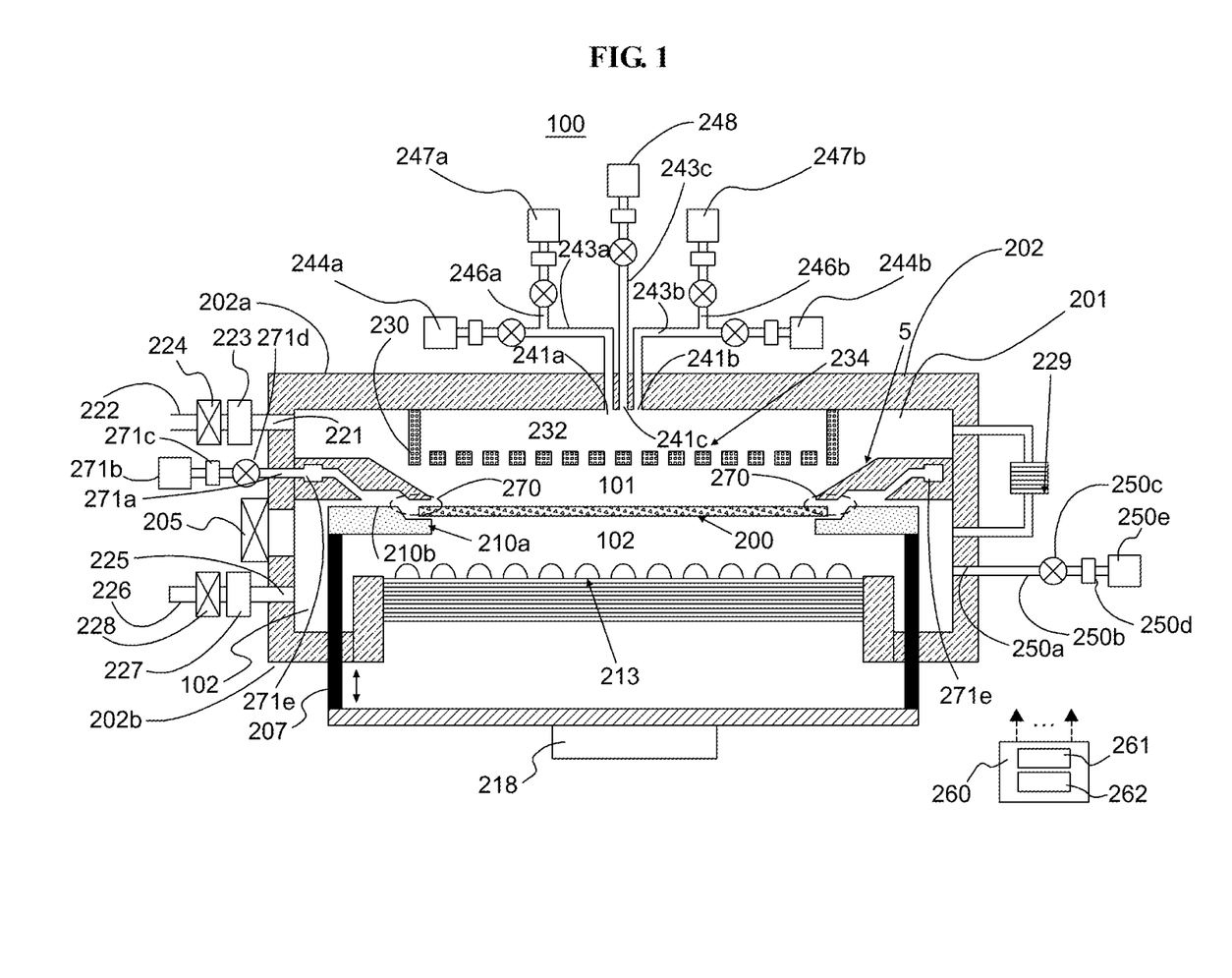
FIG. 1 is a cross-sectional view of a substrate processing apparatus according to an embodiment of the present invention.

As illustrated in FIG. 1, the substrate processing apparatus 100 includes a processing container 202. The processing container 202 is configured, for example, as a flat airtight container having a circular cross-section. Also, sidewalls or a lower wall of the processing container 202 is formed of a metal material, e.g., aluminum (Al) or stainless steel (steel-use-stainless (SUS)).

The processing container 202 includes an upper processing container 202a, a lower processing container 202b and a shower head 230 which is a ceiling portion.

A space surrounded by the upper processing container 202a and a lower end of the shower head 230 and located above a wafer 200 (substrate) will hereinafter be referred to as a processing space 101, and a space surrounded by the lower processing container 202b and located below the wafer 200 (substrate) will hereinafter be referred to as a transfer space 102 (standby chamber). A structure located below the upper processing container 202a and the lower end of the shower head 230 and surrounding the processing space 101 will hereinafter be referred to as a processing chamber 201.

At a side of the lower processing container 202b, a substrate loading exit (not shown) is installed adjacent to a gate valve 205 and the wafer 200 is moved between transfer chambers (not shown) via the substrate loading exit. A plurality of lift pins 207 are installed on a bottom portion of the lower processing container 202b. A lamp heater 213 which is a heating unit is installed at a bottom portion of the lower processing container 202b in a direction of a back side of a substrate support unit 210 which will be described below and a back side of the wafer 200.

In the processing chamber 201, the substrate support unit 210 configured to support the wafer 200 is present. The substrate support unit 210 includes a support mechanism 210a configured to support the back side of the wafer 200 and a support unit 210b supported by the plurality of lift pins 207. The height of a wafer placing surface of the support mechanism 210a is set to be lower than the height of a surface of the support unit 210b. When the wafer 200 is placed on the wafer placing surface, a surface of the wafer 200 is set to be at the same height as the surface of the support unit 210b. Thus, a side surface of the wafer 200 is not influenced by the flow of a gas supplied from a fifth gas supply unit which will be described below. Also, the substrate support unit 210 is configured to support an outer circumferential surface of the wafer 200. In the lower processing container 202b, through-holes through which the plurality of lift pins 207 pass are formed at locations corresponding to the plurality of lift pins 207.

The substrate support unit 210 is supported by the plurality of lift pins 207. The plurality of lift pins 207 pass through a bottom portion of the processing container 202, and are connected to a lifting mechanism 218 outside the processing container 202. By moving the plurality of lift pins 207 and the substrate support unit 210 upward/downward by operating the lifting mechanism 218, the wafer 200, which is to be placed on the substrate support unit 210, may be moved upward/downward. The vicinity of lower ends of the plurality of lift pins 207 is covered with a bellows (not shown) and the inside of the processing container 202 is maintained in an air tight state.

The substrate support unit 210 is moved downward such that the wafer placing surface is located at the substrate loading exit (i.e., a wafer transfer position) so as to transfer the wafer 200, and is moved upward such that the wafer 200 is located at a processing position (i.e., a wafer processing position) in the processing chamber 201 so as to process the wafer 200 as illustrated in FIG. 1.

[Gas Introduction Hole]

In an upper surface (a ceiling wall) of the shower head 230 (which will be described in detail below) installed above the processing chamber 201, a gas introduction hole 241a, a gas introduction hole 241b and a gas introduction hole 241c are formed to supply various gases into the processing chamber 201. The structure of a gas supply system connected to the gas introduction holes 241a, 241b and 241c will be described below.

[Shower Head]

The shower head 230 serving as a gas dispersion mechanism communicating with the processing chamber 201 is installed between the gas introduction holes 241a, 241b and 241c and the processing chamber 201. The gas introduction holes 241a, 241b and 241c are connected to the upper processing container 202a. Gases introduced via the gas introduction holes 241a, 241b and 241c are supplied into a buffer chamber 232 of the shower head 230 via a hole formed in the upper processing container 202a. The buffer chamber 232 is formed to be surrounded by the upper processing container 202a and a dispersion plate 234.

A lid portion of the shower head 230 is formed of a conductive metal, and may be used as an electrode to generate plasma in the buffer chamber 232 or the processing chamber 201. In this case, an insulating block is installed between the lid portion and the upper processing container 202a to insulate between the lid portion and the upper processing container 202a.

The shower head 230 includes the dispersion plate 234 between the buffer chamber 232 and the processing space 101 in the processing chamber 201 to disperse gases introduced via the gas introduction holes 241a to 241c. A plurality of through-holes are installed in the dispersion plate 234. The dispersion plate 234 is disposed above the wafer 200 to face the wafer 200.

[Supply System]

Gas supply pipes are connected to the gas introduction holes 241a to 241c, which are connected to the upper processing container 202a corresponding to the lid of the shower head 230, respectively. A first gas supply pipe 243a is connected to the gas introduction hole 241a, and a second gas supply pipe 243b is connected to the gas introduction hole 241b. A third gas supply pipe 243c is connected to the gas introduction hole 241c.

A first gas A (e.g., TiCl$_4$) and a carrier gas (e.g., N$_2$) are supplied into the processing chamber 201 via a first gas supply unit including the first gas supply pipe 243a, and a second gas B (e.g., NH$_3$) and a carrier gas (e.g., N$_2$) are supplied into the processing chamber 201 via a second gas supply unit including the second gas supply pipe 243b. A purge gas is supplied into the processing chamber 201 via a third gas supply unit. A purge gas is supplied into the standby chamber 102 via a fourth gas supply unit. A purge gas is supplied into the processing chamber 201 via a fifth gas supply unit. Each of the gas supply systems will be described in detail below.

[First Gas Supply Unit]

A first gas source 244a, a mass flow controller (MFC) which is a flow rate controller (flow rate control unit) and a valve which is an opening/closing valve are sequentially installed at the first gas supply pipe 243a from an upstream end.

A gas containing a first element (hereinafter referred to as the 'first-element-containing gas') is supplied into the processing chamber 201 via the MFC, the valve, the gas supply pipe 243a, and the shower head 230 (the buffer chamber 232).

The first-element-containing gas is a source gas, i.e., one of process gases. Here, the first element is, for example, TiCl$_4$. That is, the first-element-containing gas is, for example, a titanium-containing gas. Also, the first-element-containing gas may be in a solid, liquid or gaseous state at normal temperature and pressure. When the first-element-containing gas is in a liquid state at normal temperature and pressure, a vaporizer (not shown) may be installed between the first gas source 244a and the MFC. Here, it is assumed that the first-element-containing gas is in a gaseous state.

A downstream end of a first inert gas supply pipe 246a is connected to the first gas supply pipe 243a at a downstream side of the valve. An inert gas source 247a, an MFC which is a flow rate controller (flow rate control unit) and a valve which is an opening/closing valve are sequentially installed at the first inert gas supply pipe 246a from the upstream end.

Here, an inert gas is, for example, nitrogen (N$_2$) gas. In addition to the N$_2$ gas, for example, a rare gas such as helium (He) gas, neon (Ne) gas or argon (Ar) gas may be used as the inert gas.

The inert gas is supplied into the shower head 230 (the buffer chamber 232) and the processing chamber 201 from the first inert gas supply pipe 246a via the MFC, the valve and the first gas supply pipe 243a. The inert gas acts as a carrier gas or a dilution gas in a thin-film forming process (S104) which will be described below.

A first-element-containing gas supply unit (which may also be referred to as a titanium-containing gas supply unit) mainly includes the first gas supply pipe 243a and the MFC and the valve installed at the first gas supply pipe 243a.

A first inert gas supply unit mainly includes the first inert gas supply pipe 246a and the MFC and the valve installed at the first inert gas supply pipe 246a. The first inert gas supply unit may further include the inert gas source 247a and the first gas supply pipe 243a.

The first-element-containing gas supply unit may further include the first gas source 244a and the first inert gas supply unit.

[Second Gas Supply Unit]

A second gas source 244b, an MFC which is a flow rate controller (a flow rate control unit) and a valve which is an opening/closing valve are sequentially installed at the second gas supply pipe 243b from the upstream end.

A gas containing a second element (hereinafter referred to as the 'second-element-containing gas') is supplied into the processing chamber 201 from the second gas supply pipe 243b via the MFC, the valve, the gas supply pipe 243b and the shower head 230 (the buffer chamber 232). The second-element-containing gas may be changed into a plasma state by a remote plasma unit and radiated onto the wafer 200.

The second-element-containing gas is one of the processing gases. Also, the second-element-containing gas may be considered as a reactive gas or a modifying gas.

Here, the second-element-containing gas contains the second element that is different from the first element. The second element is, for example, oxygen (O), nitrogen (N) or carbon (C). In the present embodiment, it is assumed that the second-element-containing gas is, for example, a nitrogen-containing gas. In detail, ammonia (NH$_3$) gas is used as the nitrogen-containing gas.

A second-element-containing gas supply unit (which may also be referred to as a nitrogen-containing gas supply unit) mainly includes the second gas supply pipe 243b and the MFC and the valve installed at the second gas supply pipe 243b.

A downstream end of a second inert gas supply pipe 246b is connected to the second gas supply pipe 243b at a downstream side of the valve. At the second inert gas supply pipe 246b, an inert gas source 247b, an MFC which is a flow rate controller (a flow rate control unit) and a valve which is an opening/closing valve are sequentially installed from the upstream end.

An inert gas is supplied into the shower head 230 (the buffer chamber 232) and the processing chamber 201 from the second inert gas supply pipe 246b via the MFC, the valve and the second gas supply pipe 243b. The inert gas acts as a carrier gas or a dilution gas in the thin-film forming process (S104) which will be described below.

A second inert gas supply unit mainly includes the second inert gas supply pipe 246b and the MFC and the valve installed at the second inert gas supply pipe 246b. The second inert gas supply unit may further include the inert gas source 247b and the second gas supply pipe 243b.

The second-element-containing gas supply unit may include the second gas source 244b and the second inert gas supply unit.

[Third Gas Supply Unit]

At the third gas supply pipe 243c, an inert (third) gas source 248, an MFC which is a flow rate controller (a flow rate control unit) and a valve which is an opening/closing valve are sequentially installed from the upstream end.

An inert gas is supplied as a purge gas into the shower head 230 and the processing chamber 201 from the third gas supply pipe 243c via the MFC and the valve.

Here, the inert gas is, for example, nitrogen (N$_2$) gas. In addition to the N$_2$ gas, for example, a rare gas such as helium (He) gas, neon (Ne) gas or argon (Ar) gas may be used as the inert gas.

A third gas supply unit which is a purge gas supply unit mainly includes the inert gas supply pipe 243c, the MFC and the valve. The third gas supply unit may further include the insert gas source 248.

A gas in the shower head 230 is exhausted by the inert gas supplied to the shower head 230 from the third gas supply unit.

[Fourth Gas Supply Unit]

In the standby chamber 102, a fourth gas supply unit is installed at a side of the lower processing container 202b to supply an inert gas. An inert gas is supplied via an inert gas supply hole 250a. At a fourth gas supply pipe 250b, an inert (fourth) gas source 250e, an MFC 250d which is a flow rate controller (a flow rate control unit) and a valve 250c which is an opening/closing valve are sequentially installed from the upstream end.

An inert gas is supplied as a purge gas into the standby chamber 102 from the fourth gas supply pipe 250b via the MFC 250d and the valve 250c. The purge gas exhausts an atmosphere in the standby chamber 102 or controls pressure in the standby chamber 102 relative to the processing chamber 201, as will be described below.

Here, the inert gas is, for example, nitrogen ($N_2$) gas. In addition to the $N_2$ gas, for example, a rare gas such as helium (He) gas, neon (Ne) gas or argon (Ar) gas may be used as the inert gas.

The fourth gas supply unit which is a standby-chamber inert gas supply unit mainly includes the inert gas supply pipe 250b, the MFC 250d and the valve 250c. The fourth gas supply unit may further include the inert (fourth) gas source 250e.

[Fifth Gas Supply Unit]

A fifth gas supply unit is connected to a narrow-space region 270 which will be described below. At a fifth gas supply pipe 271a, an inert (fifth) gas source 271b, an MFC 271c which is a flow rate controller (a flow rate control unit), a valve 271d which is an opening/closing valve and a buffer space 271e are sequentially installed from the upstream end. The buffer space 271e is formed in a cylindrical shape surrounding an outer circumference of the wafer 200, and supplies a fifth gas toward the outer circumference of the wafer 200.

The fifth gas is supplied to the outer circumference of the wafer 200 in the processing chamber 201 from the fifth gas supply pipe 271a via the MFC 271c, the valve 271d and the buffer space 271e.

Here, the inert gas is, for example, nitrogen ($N_2$) gas. In addition to the $N_2$ gas, for example, a rare gas such as helium (He) gas, neon (Ne) gas or argon (Ar) gas may be used as the inert gas.

The fifth gas supply unit mainly includes the inert gas supply pipe 271a, the MFC 271c, the valve 271d and the buffer space 271e. The inert gas source 271b may be further included in the fifth gas supply unit.

[First Exhaust Unit]

An exhaust port 221 is installed on a side surface of an inner wall of the processing chamber 201 (the upper processing container 202a) to exhaust an atmosphere in the processing chamber 201. An exhaust pipe 222 is connected to the exhaust port 221. A pressure adjustor 223, such as an auto pressure control (APC) unit, configured to control the inside of the processing chamber 201 to have a predetermined pressure, and a vacuum pump 224 are sequentially connected in series to the exhaust pipe 222. A first exhaust unit (exhaust line) mainly includes the exhaust port 221, the exhaust pipe 222, the pressure adjustor 223 and the vacuum pump 224.

[Second Exhaust Unit]

An inert gas is supplied into the standby chamber 102 via the inert gas supply hole 250a formed in the side surface of the inner wall of the lower processing container 202b. An exhaust port 225 is installed at a side surface of an inner wall of the standby chamber 102 [the lower processing container 202b] to exhaust an atmosphere in the standby chamber 102. An exhaust pipe 226 is connected to the exhaust port 225. A pressure adjustor 227, such as an APC unit, configured to control the inside of the standby chamber 102 to have a predetermined pressure, and a vacuum pump 228 are sequentially connected in series to the exhaust pipe 226. A second exhaust unit (exhaust line) mainly includes the exhaust port 225, the exhaust pipe 226, the pressure adjustor 227 and the vacuum pump 228.

[Differential Pressure Gauge]

A differential pressure gauge 229 is installed on a side surface of the processing container 202 to measure a differential pressure between an atmosphere in the processing chamber 201 and an atmosphere in the standby chamber 102. Based on an output value of the differential pressure gauge 229, at least one among the gas supply units and as the gas exhaust units performs pressure control in the processing chamber 201 and the standby chamber 102.

[Controller]

The substrate processing apparatus 100 includes a controller 260 configured to control operations of various elements of the substrate processing apparatus 100. The controller 260 includes at least an operation unit 261 and a memory unit 262. The controller 260 calls a substrate processing apparatus program or a control recipe from the memory unit 262 according to a command received therefrom or a user, and controls various elements of the substrate processing apparatus 100 according to this program or the control recipe.

[Narrow-Space Region]

A narrow-space forming member 5 is installed on a side surface of an inner wall of the upper processing container 202a. A purge gas 271 which is an inert gas is supplied to the narrow-space region 270 (which is formed in a peripheral region of the wafer 200 by the narrow-space forming member 5) via the fifth gas supply unit. The narrow-space region 270 causes the purge gas 271 to flow uniformly on the wafer 200 via the peripheral region of the wafer 200. By maintaining pressure applied to the narrow-space region 270 to be higher than pressure applied to the substrate processing chamber 201 which is a surface region of the wafer 200, a source gas may be prevented from being diffused to not only the narrow-space region 270 but also the standby chamber 102 which is a back side region of the wafer 200.

(2) Substrate Processing Process

Figure 2:
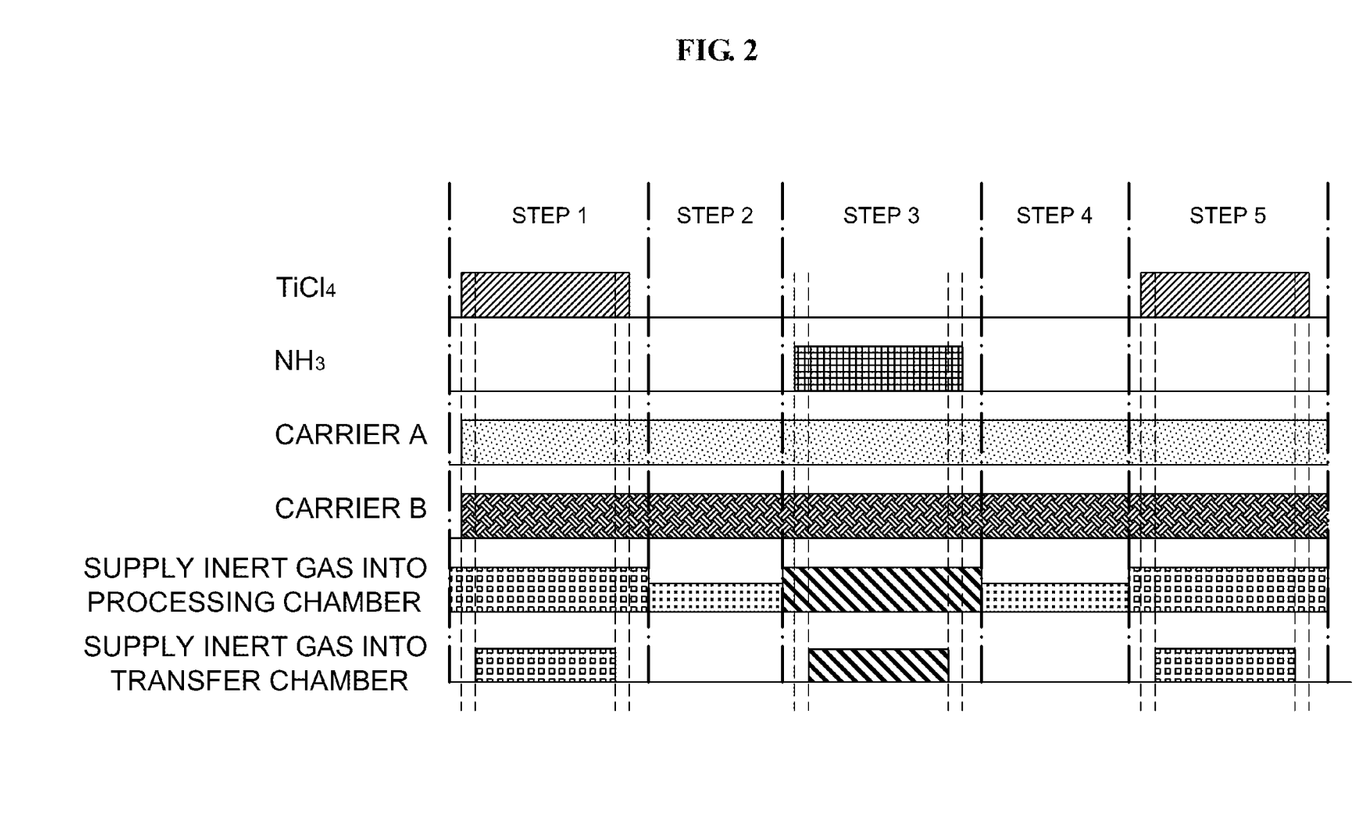
FIG. 2 illustrates a film forming sequence of a substrate processing process according to an embodiment of the present invention.
Figure 3:
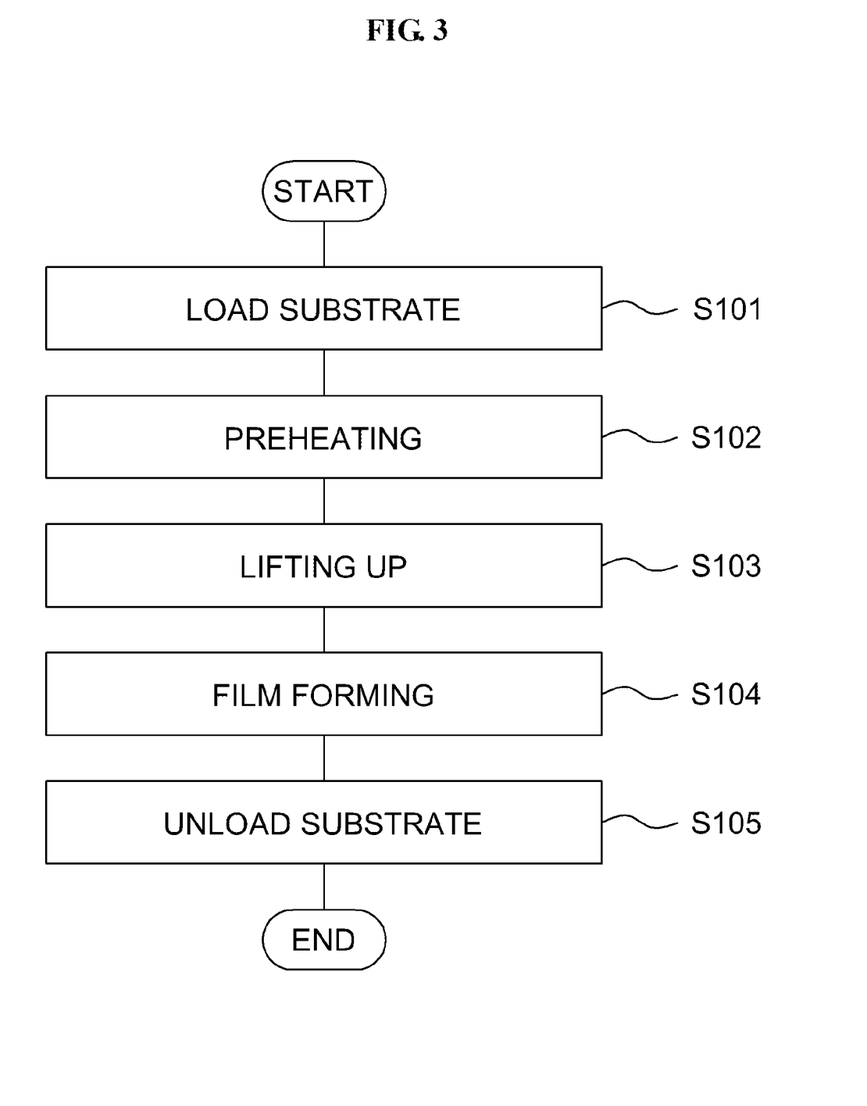
FIG. 3 is a flowchart of a film forming process included in a substrate processing process according to an embodiment of the present invention.
Figure 4:
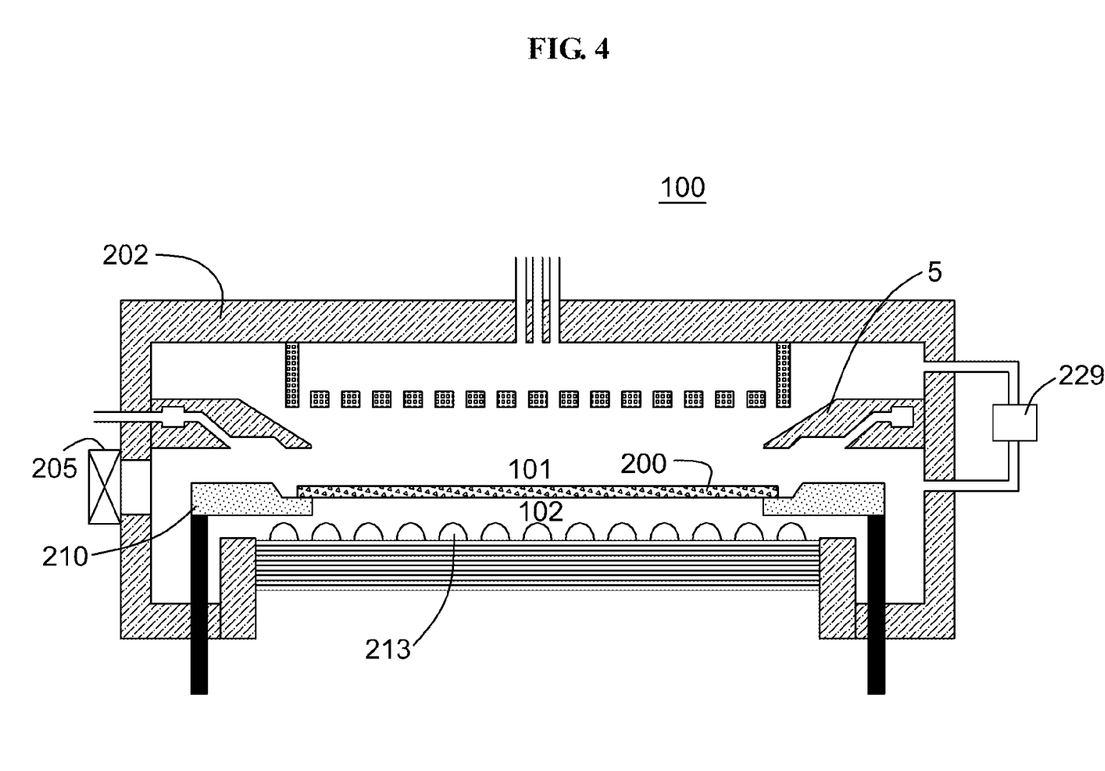
FIG. 4 is a diagram illustrating a substrate processing apparatus when preheating is performed according to an embodiment of the present invention.

Next, a process of forming a thin film on the wafer 200 using the substrate processing apparatus 100 will be described with reference to FIGS. 2 to 4 below. FIG. 2 illustrates a film forming sequence according to an embodiment of the present invention. FIG. 3 is a flowchart of a film forming process according to an embodiment of the present invention. FIG. 4 is a diagram illustrating the relationship between the locations of the wafer 200 and the lamp heater 213 when the wafer 200 is preheated. For convenience of explanation, only parts of FIG. 4 that are related to FIG. 1 will be described and some elements of FIG. 4 will not be described herein. In the following description, the operations of various elements of the substrate processing apparatus 100 are controlled by the controller 260. Although the lamp heater 213 is illustrated as being exposed in the drawings, a lamp box may be installed to surround the lamp heater 213 to prevent foreign substances such as particles from being attached thereto.

Here, a case in which a titanium nitride (TiN) film is formed as a thin film on the wafer 200 using $TiCl_4$ gas as a first-element-containing gas and ammonia ($NH_3$) gas as a second-element-containing gas will be described. Also, for example, a predetermined film may be formed on the wafer 200 beforehand. Also, a predetermined pattern may be formed on the wafer 200 or the predetermined film.

[Substrate Loading Process (S101)]

In the substrate processing apparatus 100, the substrate support unit 210 is moved downward to the wafer transfer position, as illustrated in FIG. 4. Then, the gate valve 205 is opened, and the wafer 200 (a substrate to be processed) is loaded into the processing chamber 201 using a wafer transfer machine (not shown) and transferred on the substrate support unit 210. Thus, the wafer 200 is supported on the substrate support unit 210 in a horizontal posture.

When the wafer 200 is loaded into the processing container 202, the wafer transfer machine is withdrawn to the outside of the processing container 202, the gate valve 205 is closed, and the inside of the processing container 202 is air-tightly closed.

[Preheating Process (S102)]

In the substrate processing apparatus 100, the amount of power to be supplied to the lamp heater 213 is adjusted and a surface temperature of the wafer 200 is increased to control the temperature of the wafer 200 to be equal to a predetermined processing temperature in a state in which the substrate support unit 210 is moved downward to the wafer transfer position of the wafer 200 (see FIG. 4). In this case, an output of a portion of the lamp heater 213 opposite a peripheral region of the wafer 200 may be increased, and an output of a portion of the lamp heater 213 opposite a central portion of the wafer 200 may be then increased. By controlling the output of the lamp heater 213 as described above, the difference between the temperatures of the central portion and the peripheral region of the wafer 200 may be reduced to suppress the wafer 200 from being bent. Even if the wafer 200 is bent, the quality of a film is hardly influenced by the bent wafer 200 but a gap is likely to be formed between the substrate support unit 210 and the wafer 200 when the wafer 200 is bent. A gap may be prevented from occurring between the substrate support unit 210 and the wafer 200 by controlling the output of the lamp heater 213. Alternatively, an output of the lamp heater 213 may be controlled by dividing the wafer 200 into several zones in a direction of the circumference of the wafer 200.

[Lifting-Up Process (S103)]

Then, the substrate support unit 210 is moved upward to place the wafer 200 on the substrate support unit 210.

[Thin-Film Forming Process (S104)]

Next, the thin-film forming process (S104) is performed. A basic flow of the thin-film forming process (S104) will now be described and the details of the present embodiment will be described below.

In the thin-film forming process (S104), $TiCl_4$ gas is supplied into the processing chamber 201 via the buffer chamber 232 of the shower head 230. The supply of the $TiCl_4$ gas is suspended a predetermined time after the $TiCl_4$ gas is supplied, and the $TiCl_4$ gas is discharged from the buffer chamber 232 and the processing chamber 201 using a purge gas.

After the $TiCl_4$ gas is discharged, ammonia gas is supplied into the processing chamber 201 via the buffer chamber 232. The ammonia gas reacts with a titanium-containing film formed on the wafer 200 to form a titanium nitride (TiN) film. After a predetermined time passes, the supply of the ammonia gas is stopped and the ammonia gas is discharged from the shower head 230 and the processing chamber 201 using a purge gas.

In the thin-film forming process (S104), the TiN film is formed to a desired thickness by repeatedly performing the flow of this process described above. [0073]

[Substrate Unloading Process (S105)]

Next, the substrate support unit 210 is moved downward. Then, the gate valve 205 is opened, and the wafer 200 is unloaded to the outside of the processing container 202 using the wafer transfer machine. Then, in order to end the substrate processing process, the supply of the inert gas into the processing container 202 from the third gas supply unit is stopped.

The thin-film forming process (S104) will be described in more detail with reference to FIG. 2. In FIG. 2, '$TiCl_4$' denotes a timing at which $TiCl_4$ gas is supplied via the first gas supply unit. '$NH_3$' denotes a timing at which $NH_3$ gas is supplied via the second gas supply unit. 'Carrier A' denotes a timing at which a carrier gas is supplied via the first gas supply unit. 'Carrier B' denotes a timing at which a carrier gas is supplied via the second gas supply unit. 'Supply of inert gas into processing chamber' denotes a timing at which an inert gas (purge gas) is supplied via the third gas supply unit. 'Supply of inert gas into transfer chamber' denotes a timing at which an inert gas (purge gas) is supplied via the fourth gas supply unit. During the above process, an atmosphere in the processing chamber 201 is exhausted via the first exhaust unit and an atmosphere in the standby chamber 102 is exhausted via the second exhaust unit.

[Step 1]

$TiCl_4$ gas is supplied to a surface of a substrate to form a Ti-containing film on the substrate. In this case, while the valve of the first gas supply pipe 243a, the valve of the second gas supply pipe 243b, the valve of the third gas supply pipe 243c, and the valve 250c of the fourth gas supply unit are closed, the valve of the fifth gas supply unit is opened to supply an inert gas into the processing chamber 201 via the fifth gas supply unit. That is, a purge gas is supplied into the processing chamber 201 at a predetermined flow rate via the fifth gas supply unit before $TiCl_4$ gas serving as a first processing gas is supplied into the processing chamber 201. By supplying the purge gas before the supply of the $TiCl_4$ gas serving as the first processing gas, the substrate may be prevented from being misaligned due to a change in pressure occurring when the first processing gas is supplied and a wall of an inert gas is formed in the narrow-space region 270 before the first processing gas is supplied.

For example, when substrate misalignment occurs, the processing chamber 201 and a transfer chamber 101 are likely to communicate with each other and a gas is supplied and attached to the lamp heater 213 via a gap via which the processing chamber 201 and the transfer chamber 101 communicate with each other.

In the present embodiment, $TiCl_4$ gas is prevented from flowing into the standby chamber 102 adjacent to a back side of the substrate by preventing the misalignment of the substrate as described above. Also, a gas is prevented from flowing into the narrow-space region 270 by forming a wall of an inert gas in the narrow-space region 270. Accordingly, byproducts may be prevented from being generated in the narrow-space region 270.

When a predetermined time elapses after supply of an inert gas via the fifth gas supply unit starts, the valve of the first gas supply pipe 243a and the valve of the first inert gas supply pipe 246a are opened to start supply of $TiCl_4$ gas serving as a processing gas and a carrier gas thereof. After the supply of the $TiCl_4$ gas starts, the valve 250c is opened to supply an inert gas into the standby chamber 102. Also, in order to prevent a gas in the processing chamber 201 from flowing into the second gas supply pipe 243b, the valve of the second inert gas supply pipe 246b is opened to start supply of an inert gas at a flow rate causing pressure in the processing chamber 201 to be higher than that of the transfer chamber 101 while the valve of the second gas supply pipe 243b is closed. As described above, the supply of the gases begin step by step to decrease a change in pressure, thereby suppressing misalignment of the substrate.

After a predetermined time elapses, the valve 250c is closed simultaneously with opening of the valve 271d, the valve of the first gas supply pipe 243a and the valve of the first inert gas supply pipe 246a. Also, after a predetermined time elapses, the valve of the first gas supply pipe 243a is closed to stop the supply of the TiCl$_4$ gas. Since the supply of the gas is stopped step by step as described above, a change in pressure may decrease and the pressure in the processing chamber 201 may be maintained to be higher than that of the transfer chamber 101. Even when Step 2 which is a subsequent step is performed after the Ti-containing film is formed on the surface of the substrate, the substrate may be more reliably suppressed from being misaligned.

[Step 2]

After Step 1, the valve 271d is tightened to decrease the flow rate of the inert gas supplied to the processing chamber 201 via the narrow-space region 270. In this case, the degrees of openness of the valve of the first inert gas supply pipe 246a and the valve of the second inert gas supply pipe 246b are maintained to be the same as in Step 1. By controlling the degrees of openness of the valves of the first inert gas supply pipe 246a and the second inert gas supply pipe 246b, an atmosphere in the processing chamber 201 is exhausted while a residual gas is prevented from flowing into the narrow-space region 270.

Also, in order to increase the efficiency of exhausting or remove a residual gas from a gas tank of the shower head 230, the valve of the third gas supply unit may be opened to supply an inert gas serving as a purge gas.

[Step 3]

NH$_3$ is supplied to a surface of the substrate to form a TiN film on the substrate. In this case, the valve of the fifth gas supply unit is opened to supply an inert gas into the processing chamber 201 from the fifth gas supply unit, while the valve of the first gas supply pipe 243a, the valve of the second gas supply pipe 243b, the valve of the third gas supply pipe 243c and the valve 250c of the fourth gas supply unit are closed and the valve of the first inert gas supply pipe 246a and the valve of the second inert gas supply pipe 246b are open. That is, a purge gas is supplied at a predetermined flow rate into the processing chamber 201 via the fifth gas supply unit before NH$_3$ gas serving as a second processing gas is supplied into the processing chamber 201. By supplying the purge gas before the supply of the NH$_3$ gas serving as the second processing gas, not only the substrate may be suppressed from being misaligned due to a change in pressure occurring when the second processing gas is supplied but also a wall of an inert gas is formed in the narrow-space region 270 before the second processing gas is supplied.

For example, when the substrate is misaligned with respect to a substrate placing position, the processing chamber 201 and the transfer chamber 101 are likely to communicate with each other due to the misalignment of the substrate and a gas is supplied and attached to the lamp heater 213 via a gap via which the processing chamber 201 and the transfer chamber 101 communicate with each other.

In the present embodiment, the wafer 200 is prevented from being misaligned with respect to a substrate placing position so as to prevent NH$_3$ gas serving as a processing gas from flowing into the standby chamber 102 adjacent to the back side of the wafer 200 as described above. Also, a wall of an inert gas is formed in the narrow-space region 270 to prevent a gas from flowing into the narrow-space region 270. Thus, byproducts are not generated in the narrow-space region 270. Also, a flow rate of an inert gas (purge gas) preventing a source gas from flowing is set to be proportional to the sum of a flow rate of a source gas (processing gas) and a flow rate of a carrier gas, and the flow rates of these gases may be increased or decreased at the same timing.

When a predetermined time elapses after supply of an inert gas via the fifth gas supply unit starts, the valve of the second gas supply pipe 243b is opened to start supply of NH$_3$ gas as a processing gas. After the supply of the NH$_3$ gas starts, the valve 250c is opened to supply an inert gas into the standby chamber 102. Also, in order to prevent a gas in the processing chamber 201 from flowing into the second gas supply pipe 243b, the valve of the second inert gas supply pipe 246b is opened while the valve of the second gas supply pipe 243b is closed, and supply of an inert gas begins at a flow rate causing pressure in the processing chamber 201 to be higher than that in the transfer chamber 101.

After a predetermined time elapses, the valve 271d, the valve of the second gas supply pipe 243b and the valve of the second inert gas supply pipe 246b are opened and the valve 250c is closed. Then, after a predetermined time elapses, the valve of the second gas supply pipe 243b is closed to stop the supply of the NH$_3$ gas. By stopping the supply of the gases step by step, a change in pressure may be decreased and the pressure in the processing chamber 201 may be maintained to be higher than that in the transfer chamber 101. Thus, when a desired film is formed on a surface of a substrate and Step 4 which is a subsequent step is performed, the substrate may be more reliably suppressed from being misaligned.

[Step 4]

After Step 3, the valve 271d is tightened to decrease the flow rate of the inert gas supplied to the processing chamber 201 via the narrow-space region 270. In this case, the degrees of openness of the valve of the first inert gas supply pipe 246a and the valve of the second inert gas supply pipe 246b are maintained to be the same as in Step 1. By controlling the degrees of openness, an atmosphere in the processing chamber 201 may be exhausted while a residual gas is prevented from flowing into the narrow-space region 270.

Also, in order to increase the efficiency of exhausting or remove a residual gas from the gas tank in the shower head 230, the valve of the third gas supply unit may be opened to supply an inert gas serving as a purge gas.

[Step 5]

TiCl$_4$ is supplied to a surface of the substrate to form a desired film on the substrate. In this case, the valve of the fifth gas supply unit is opened to supply an inert gas into the processing chamber 201 from the fifth gas supply unit, while the valve of the first gas supply pipe 243a, the valve of the second gas supply pipe 243b, the valve of the third gas supply pipe 243c and the valve 250c of the fourth gas supply unit are closed and the valve of the first inert gas supply pipe 246a and the valve of the second inert gas supply pipe 246b are opened. That is, a purge gas is supplied into the processing chamber 201 via the fifth gas supply unit at a predetermined flow rate before TiCl$_4$ gas is supplied as a first processing gas into the processing chamber 201. By supplying the purge gas before the supply of the TiCl$_4$ gas serving as the first processing gas, not only the substrate may be suppressed from being misaligned due to a change in pressure when the first processing gas is supplied but also a wall of an inert gas is formed in the narrow-space region 270 before the first processing gas is supplied.

If the substrate is misaligned with respect to the substrate placing position, the processing chamber 201 and the transfer chamber 101 are likely to communicate with each other due to the misalignment of the substrate and a gas may be supplied and attached to the lamp heater 213 via a gap via which the processing chamber 201 and the transfer chamber 101 communicate with each other.

In the present embodiment, the wafer 200 is prevented from being misaligned with respect to the substrate placing position to prevent $TiCl_4$ gas which is a processing gas from flowing into the standby chamber 102 adjacent to the back side of the wafer 200 as described above. Also, a wall of an inert gas is formed in the narrow-space region 270, thereby preventing a gas from flowing into the narrow-space region 270. Accordingly, byproducts are not generated in the narrow-space region 270.

When a predetermined time elapses after supply of an inert gas via the fifth gas supply unit starts, the valve of the first gas supply pipe 243a is opened to start supply of $TiCl_4$ gas serving as a processing gas. After the supply of the $TiCl_4$ gas starts, the valve 250c is opened to supply an inert gas into the standby chamber 102. Also, in order to prevent a gas in the processing chamber 201 from flowing into the second gas supply pipe 243b, the valve of the second inert gas supply pipe 246b is opened to start supply of an inert gas at a flow rate causing the pressure in the processing chamber 201 to be higher than that in the transfer chamber 101, while the valve of the second gas supply pipe 243b is closed.

After a predetermined time elapses, the valve 250c is closed while the valve 271d, the valve of the first gas supply pipe 243a and the valve of the first inert gas supply pipe 246a are opened. Then, when a predetermined time elapses, the valve of the first gas supply pipe 243a is closed to stop the supply of the $TiCl_4$ gas. By stopping a gas step by step as described above, the pressure in the processing chamber 201 may be maintained to be higher than that in the transfer chamber 101 while decreasing a change in the pressure. Thus, even when Step 2 which is a subsequent step is performed after a desired film is formed on a surface of the substrate, the substrate may be more reliably suppressed from being misaligned.

After Step 5, Steps 2 to 5 are repeatedly performed to form a TiN film to a desired thickness.

In Steps 1, 3 and 5, in order to control the pressure in the processing chamber 201 to be continuously higher than that in the standby chamber 102, the difference between the pressures in the processing chamber 201 and the standby chamber 102 is detected using the differential pressure gauge 229 and at least one among the gas supply units and the gas exhaust units is controlled by the controller (control unit) based on the detected difference. As described above, since the pressure in the processing chamber 201 may be maintained to be continuously higher than that in the standby chamber 102, the wafer 200 is prevented from being misaligned to suppress a processing gas from flowing into the standby chamber 102. That is, a film may be prevented from being formed on a surface of the lamp heater 213.

In particular, a total load applied to a surface of a substrate with a surface area of 707 $cm^2$ due to a pressure difference of 1 atm is about 690 kg. A substrate manufactured by micromachining may be broken by applying only a load of 5 kgf thereto. Thus, for safety, the difference between the pressures applied to a surface of a substrate (the processing chamber 201) and a back side of the substrate (the standby chamber 102) should be suppressed at 5 Torr or less. Accordingly, the differential pressure is preferably controlled in the range of 0.5 Torr to 5 Torr in consideration of the load applied to the substrate.

According to the present invention, the following one or more effects can be obtained.

Since a film is not formed on a surface of a lamp, the radiation characteristics of the lamp may be suppressed from changing, thereby improving the uniformity of a film formed on a substrate.

Also, a probability that the substrate will be misaligned may be decreased.

Also, a probability that the substrate will be bent may be decreased.

Since the substrate can be suppressed from being misaligned or bent, particles may be suppressed from being generated.

Examples of a film-forming treatment performed by the substrate processing apparatus 100 may include not only chemical vapor deposition (CVD), physical vapor deposition (PVD), atomic layer deposition (ALD) and Epi but also a treatment for forming an oxide film or a nitride film, a treatment for forming a metal-containing film, annealing, an oxidation treatment, a diffusion treatment, etc. These treatments may be performed in a process in which a pressure change occurs.

These treatments are also applicable to a group management apparatus (management server) connected to a plurality of substrate processing apparatuses 100 via a communication line and configured to manage the states of the plurality of substrate processing apparatuses 100, and a substrate processing system including such a substrate processing apparatus and a group management apparatus. The group management apparatus need not be installed on a floor (clean room) unlike a substrate processing apparatus, and may be installed in an office that is accessible to a local area network (LAN). In the group management apparatus, a storage unit (database), a control unit, a manipulation unit and a display unit need not be integrally formed and may be installed separately. Also, the group management apparatus may be configured to manipulate data (e.g., install data), which is stored in a database installed in a clean room, on a manipulation screen using a terminal device disposed in an office at a remote place.

Also, the program described above may have been recorded on a non-transitory computer-readable recording medium, e.g., a hard disk, a flexible disk, a compact disc, etc. that can be read by a computer, and may be installed from this recording medium to a control unit of a system.

According to the present invention, a substrate processing apparatus capable of forming a thin film in a groove having high step coverage while maintaining high productivity, a method of manufacturing a semiconductor device and a non-transitory computer-readable recording medium are provided.

The scope of the present invention is defined in the claims but may include embodiments added hereinafter.

[Supplementary Note 1]

According to one aspect of the present invention, there is provided a substrate processing apparatus including:

a substrate processing chamber configured to process a substrate;

a gas supply unit configured to alternately supply a first processing gas and a second processing gas to the substrate when processing the substrate;

a substrate support unit including a support mechanism configured to support a portion of a back side of the substrate and a support unit configured to support the support mechanism;

a heating unit configured to heat the substrate from the back side thereof;

a standby chamber configured to accommodate the substrate support unit in standby position; and a control unit configured to control at least one of the gas supply unit and a gas exhaust unit in a manner that an inner pressure of the substrate processing chamber is higher than that of the standby chamber.

[Supplementary Note 2]

The substrate processing apparatus of Supplementary note 1, the apparatus further including:

a purge gas supply unit configured to supply a purge gas while the substrate support unit is in a substrate processing position; and a standby chamber inert gas supply unit configured to supply an inert gas into the standby chamber.

[Supplementary Note 3]

In the substrate processing apparatus of Supplementary note 2, the control unit is configured to control the gas supply unit to supply the first processing gas or the second processing gas after controlling the purge gas supply unit to supply the purge gas.

[Supplementary Note 4]

In the substrate processing apparatus of Supplementary note 2 or 3, the control unit is configured to control the gas supply unit to supply the first processing gas or the second processing gas while controlling the purge gas supply unit to supply the purge gas, and configured to control the purge gas supply unit to reduce an amount of the purge gas supplied by purge gas supply unit after stopping a supply of the first processing gas or the second processing gas after a predetermined time elapses.

[Supplementary Note 5]

In the substrate processing apparatus of any one of Supplementary notes 2 to 4, the control unit is configured to: (a) control the gas supply unit to supply one of the first processing gas and the second processing gas while controlling the purge gas supply unit to supply the purge gas to form a first film; (b) control the purge gas supply unit to continuously supply the purge gas after stopping a supply of the one of the first processing gas and the second processing gas after forming the first film to purge the one of the first processing gas and the second processing gas from the substrate processing chamber; and (c) control the gas supply unit to supply one of the first processing gas and the second processing gas other than the one supplied in the process (a) after increasing an amount of the purge gas supplied.

[Supplementary Note 6]

In the substrate processing apparatus of Supplementary note 5, the control unit is configured to: (a) control the purge gas supply unit to purge the one of the first processing gas and the second processing gas from the substrate processing chamber; (b) control the gas supply unit to start supplying one of the first processing gas and the second processing gas after the process (a); and (c) control the standby chamber inert gas supply unit to supply the inert gas into the standby chamber after the process (b).

[Supplementary Note 7]

According to another aspect of the present invention, there is provided a method of manufacturing a semiconductor device, including:

(a) moving a substrate to a substrate processing position to expose a surface of the substrate to an atmosphere in a processing chamber while a substrate support unit stands by in a standby chamber; and (b) alternately supplying the first processing gas and the second processing gas with an inner pressure of a substrate processing chamber being higher than that of a standby chamber while heating the substrate from a back side thereof.

[Supplementary Note 8]

According to another aspect of the present invention, there is provided a single-wafer type atomic layer deposition (ALD) apparatus configured to uniformly supply a source to a substrate via a shower head with a plurality of holes.

[Supplementary Note 9]

According to another aspect of the present invention, there is provided a single-wafer type ALD apparatus configured to heat a substrate from a back side of the substrate using a lamp.

[Supplementary Note 10]

According to another aspect of the present invention, there is provided a single-wafer type ALD apparatus having a function of controlling an output of a lamp by dividing a substrate into several zones in a direction of a circumference of the substrate.

[Supplementary Note 11]

According to another aspect of the present invention, there is provided a single-wafer type ALD apparatus including a mechanism configured to supply a purge gas to a peripheral region of a substrate so as to prevent a source gas from flowing to the peripheral region and a back side of the substrate.

[Supplementary Note 12]

In the single-wafer type ALD apparatus of Supplementary note 11, a flow rate of the purge gas is set to be proportional to the sum of a flow rate of the source gas and a flow rate of a carrier gas so as to prevent the source gas from flowing, and the flow rates of the purges gas, the source gas and the carrier gas are increased/decreased at the same timing.

[Supplementary Note 13]

According to another aspect of the present invention, there is provided a single-wafer type ALD apparatus configured to perform pressure control so as to increase pressure applied to a surface of a substrate to be continuously higher by 0.5 Torr to 3 Torr than pressure applied to a back side of the substrate when the substrate is located at an upper position.

[Supplementary Note 14]

According to another aspect of the present invention, there is provided a single-wafer type ALD apparatus configured to form a film on a substrate by moving the substrate to an upper position after the substrate is preheated at a lower position adjacent to a lamp.

[Supplementary Note 15]

According to another aspect of the present invention, there is provided a single-wafer type ALD apparatus configured to increase an output of a portion of a lamp corresponding to a peripheral region of a substrate when the substrate is preheated, and then increase an output of a portion of the lamp corresponding to a central portion of the substrate.

What is claimed is:

1. A method of manufacturing a semiconductor device, comprising:

(a) transferring a substrate from a standby chamber to a substrate processing position in a substrate processing chamber by a substrate support unit;

(b) supplying an inert gas into the substrate processing chamber with the substrate in the substrate processing position such that an inner pressure of the substrate processing chamber is higher than that of the standby chamber;
(c) alternately supplying a first processing gas and a second processing gas to the substrate while heating the substrate from a back side thereof after performing (b); and
(d) starting a supply of the inert gas into the standby chamber after a supply of the second processing gas starts and stopping the supply of the inert gas into the standby chamber before the supply of the second processing gas stops.

2. The method of claim 1, further comprising:
(e) reducing an amount of the inert gas supplied into the substrate processing chamber between supplies of the first processing gas and the second processing gas in (c).

3. The method of claim 1, further comprising:
(e) starting a supply of the inert gas into the standby chamber after a supply of the first processing gas starts and stopping the supply of the inert gas into the standby chamber before the supply of the first processing gas stops.

4. The method of claim 2, further comprising:
(f) starting a supply of the inert gas into the standby chamber after a supply of the first processing gas starts and stopping the supply of the inert gas into the standby chamber before the supply of the first processing gas stops.

5. The method of claim 1, wherein the inert gas is supplied from an outer circumferential side of the substrate into the substrate processing chamber in (b).

6. The method of claim 1, wherein
a narrow-space region around the substrate processing position is defined between the substrate support unit and a narrow-space forming member when the substrate support unit is in the substrate processing position in (a), and
the inert gas is supplied to the narrow-space region in (c).

7. A non-transitory computer-readable recording medium storing a program for causing a computer to control a substrate processing apparatus to perform:
(a) transferring a substrate from a standby chamber to a substrate processing position in a substrate processing chamber by a substrate support unit; and
(b) supplying an inert gas into the substrate processing chamber with the substrate in the substrate processing position such that an inner pressure of the substrate processing chamber is higher than that of the standby chamber;
(c) alternately supplying a first processing gas and a second processing gas to the substrate while heating the substrate from a back side thereof after performing (b); and
(d) starting a supply of the inert gas into the standby chamber after a supply of the second processing gas starts and stopping the supply of the inert gas into the standby chamber before the supply of the second processing gas stops.

8. The non-transitory computer-readable recording medium of claim 7, further comprising:
(e) reducing an amount of the inert gas supplied into the substrate processing chamber between supplies of the first processing gas and the second processing gas in (c).

9. The non-transitory computer-readable recording medium of claim 7, further comprising:
(e) starting a supply of the inert gas into the standby chamber after a supply of the first processing gas starts and stopping the supply of the inert gas into the standby chamber before the supply of the first processing gas stops.

10. The non-transitory computer-readable recording medium of claim 8, further comprising:
(f) starting a supply of the inert gas into the standby chamber after a supply of the first processing gas starts and stopping the supply of the inert gas into the standby chamber before the supply of the first processing gas stops.

11. The non-transitory computer-readable recording medium of claim 7, wherein the inert gas is supplied from an outer circumferential side of the substrate into the substrate processing chamber in (b).

12. The non-transitory computer-readable recording medium of claim 7, wherein
a narrow-space region around the substrate processing position is defined between the substrate support unit and a narrow-space forming member when the substrate support unit is in the substrate processing position in (a), and
the inert gas is supplied to the narrow-space region in (c).

* * * * *